(12) United States Patent
Cho et al.

(10) Patent No.: US 6,376,131 B1
(45) Date of Patent: Apr. 23, 2002

(54) METHODS AND STRUCTURES FOR PROTECTING RETICLES FROM ESD FAILURE

(75) Inventors: Jae Cho, Sunnyvale; Zhi-Min Ling, Cupertino; Xin X. Wu, Fremont, all of CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/542,127

(22) Filed: Apr. 4, 2000

(51) Int. Cl.$^7$ ............................................... G03F 9/00
(52) U.S. Cl. ......................................................... 430/5
(58) Field of Search ..................... 430/5, 322; 716/19, 716/20, 21

(56) References Cited

U.S. PATENT DOCUMENTS

| | | |
|---|---|---|
| 3,949,131 A | 4/1976 | Fraser |
| 5,242,770 A | 9/1993 | Chen et al. ..................... 430/5 |
| 5,447,810 A | 9/1995 | Chen et al. ..................... 430/5 |
| 5,989,754 A * | 11/1999 | Chen et al. ..................... 430/5 |

FOREIGN PATENT DOCUMENTS

EP          0574092 A       12/1993

OTHER PUBLICATIONS

Patent Abstracts of Japan, vol. 007, No. 256 (P–236), Nov. 15, 1983 (Nov. 15, 1983) & JP 58 140742 A (Hitachi Seisakusho KK), Aug. 1983 (Aug. 20, 1983).

Patent Abstracts of Japan, vol. 008, No. 151 (P–286), Jul. 13, 1984 (Jul. 13, 1984) & JP 59 048767 A (tokyo Shibaura Denki KK), Mar. 21, 1984 (Mar. 21, 1984).

* cited by examiner

Primary Examiner—S. Rosasco
(74) Attorney, Agent, or Firm—Patrick T. Bever, Esq.; Edel M. Young

(57) ABSTRACT

A reticle that is modified to prevent bridging of the masking material (e.g., chrome) between portions of the lithographic mask pattern during an integrated circuit fabrication process. According to a first aspect, the modification involves electrically connecting the various portions of the lithographic mask pattern that balance charges generated in the portions during fabrication processes. In one embodiment, sub-resolution wires that extend between the lithographic mask pattern portions facilitate electrical conduction between the mask pattern portions, thereby equalizing dissimilar charges. In another embodiment, a transparent conductive film is formed over the lithographic mask pattern to facilitate conduction. In accordance with a second aspect, the modification involves separating the various portions of the lithographic mask pattern into relatively small segments by providing sub-resolution gaps between the various portions, thereby minimizing the amount of charge that is generated on each portion.

5 Claims, 5 Drawing Sheets

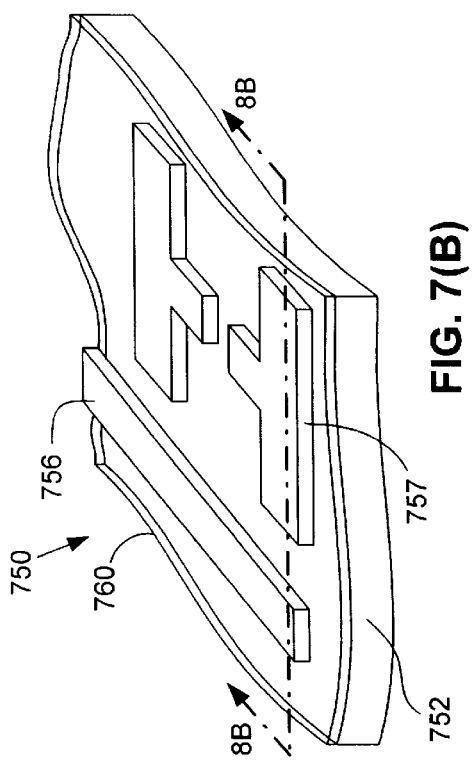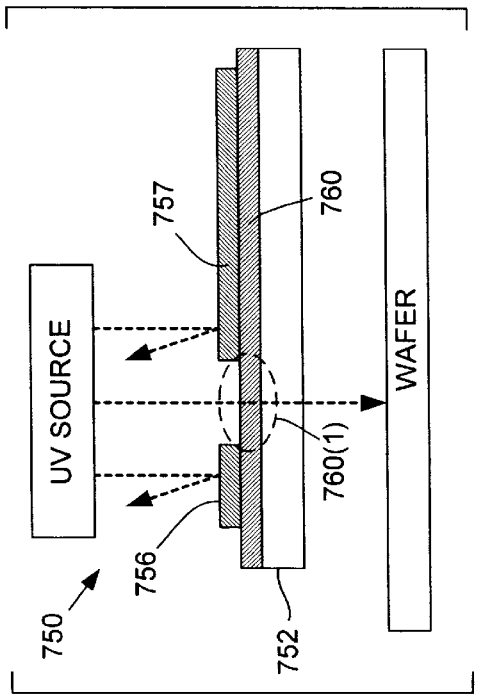
FIG. 7(A)
FIG. 8(A)
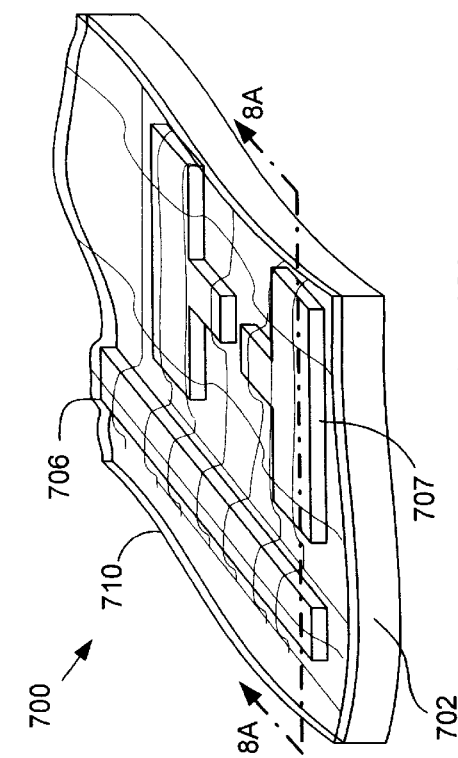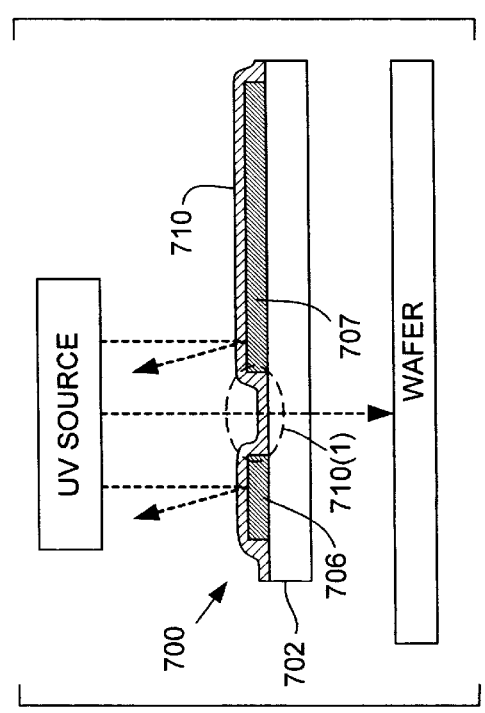
FIG. 7(B)
FIG. 8(B)

METHODS AND STRUCTURES FOR PROTECTING RETICLES FROM ESD FAILURE

FIELD OF THE INVENTION

The present invention relates to the fabrication of integrated circuits, and more particularly to reticles (masks) used during the fabrication of integrated circuits.

BACKGROUND

Integrated circuit (IC) design typically utilizes computer simulation tools to help create a circuit schematic, which typically includes individual devices that are coupled together to perform a certain function. To actually fabricate an IC that performs this function, the circuit schematic must be translated into a physical representation known as a layout using computer-aided design (CAD) tools. The layout translates the discrete circuit elements of the circuit schematic into shapes that are used to construct the individual physical components of the circuit, such as gate electrodes, field oxidation regions, diffusion regions, and metal interconnections.

CAD tools that generate the layout are usually structured to function under a set of predetermined design rules in order to produce a functional circuit. These design rules are often determined by certain processing and design limitations defined by the particular IC fabrication process to be used, such as design rules defining the space tolerance between devices or interconnect lines that prevent undesirable interaction between devices or lines. Design rule limitations are frequently referred to as critical dimensions. For example, a critical dimension of a circuit is commonly defined as the smallest width of a line or the smallest space between lines that can be supported by an IC fabrication process. Consequently, the critical dimension determines the overall size and density of the IC.

The layout is optically transferred onto a semiconductor substrate using a series of lithographic reticles (masks) and an exposure tool. Photolithography is a well-known process for transferring geometric shapes (mask pattern portions) present on each reticle onto the surface of a semiconductor substrate (e.g., a silicon wafer) using the exposure tool (e.g., an ultra-violet light source). In the field of IC lithographic processing, a photosensitive polymer film called photoresist is normally applied to the wafer and then allowed to dry. The exposure tool is utilized to expose the wafer with the proper geometrical mask patterns by transmitting UV light or radiation through the reticles. After exposure, the wafer is treated to develop the mask images transferred to the photosensitive material. These masking images are then used to create the device features of the circuit.

An important limiting characteristic of the exposure tool is its resolution value. The resolution value for an exposure tool is defined as the minimum mask pattern feature that the exposure tool can repeatedly expose onto the wafer.

FIG. 1 is a perspective view showing a simplified conventional reticle 100 that is being used during the optical transfer of an integrated circuit portion onto a semiconductor substrate 110. Reticle 100 includes an opaque masking material (e.g., chrome) that is deposited on a transparent substrate 102 and etched to form a lithographic mask pattern 105. During an integrated circuit fabrication process, ultra-violet (UV) light or radiation emitted from an exposure tool (not shown) is transmitted through reticle 100, thereby forming an image 112 of mask pattern 105 on semiconductor substrate 110. As indicated by the tapered dashed lines in FIG. 1, the lithographic process typically utilizes an optical reduction system such that image 112 is substantially smaller than (e.g., ⅕) the size of lithographic mask pattern 105. Note that the resolution values of mask pattern 105 are indicated as a width W of a mask pattern portion 106, and a space S between mask pattern portion 106 and mask pattern portion 107. Width W and space S represent the smallest dimensions that can be repeatedly transferred onto semiconductor substrate 110 by the exposure tool, and produce structures meeting the critical dimensions defined by the IC fabrication process.

FIG. 2 is a plan view showing a portion of reticle 100 in which some of the masking material has melted and formed a bridge 210 between mask pattern portions 106 and 107, thereby generating flaws in the IC formed on semiconductor substrate 110 (see FIG. 1).

Space S continues to decrease as improved stepper designs have allowed the resolution values of fabrication processes to decrease, thereby increasing the likelihood of charge transfer between portions 106 and 107. Eventually, as is being experienced with state-of-the-art fabrication processes, the combination of charge stored in mask pattern portions 106 and 107 and the small space S separating these portions results in melting of the masking material to form bridge 210.

What is needed is a structure and method that prevent bridging of the masking material between adjacent portions of the mask pattern, thereby facilitating the development of fabrication processes that define smaller resolution values.

SUMMARY

The present invention is directed to a reticle that is modified to prevent bridging of the masking material (e.g., chrome) between adjacent portions of the lithographic mask pattern during an IC fabrication process. As described above, this bridging effect is caused when dissimilar charges that are generated in adjacent mask pattern portions cause the masking material to melt and flow between the mask pattern portions. The present invention prevents bridging by either equalizing or minimizing these dissimilar charges, thereby reducing the potential between adjacent portions below that required to melt the masking material to form undesirable bridges. Accordingly, the present invention facilitates the development of fabrication processes that define ever-smaller resolution values.

According to a first aspect of the present invention, a reticle is modified to provide electrical connections between the various portions of the lithographic mask pattern, thereby balancing dissimilar charges generated in the portions during fabrication processes.

In one embodiment, sub-resolution wires are provided between the mask pattern portions to balance dissimilar charges. The sub-resolution wires are less than the resolution value of an associated exposure tool, and therefore do not generate lithographic features on the underlying semiconductor substrate during the fabrication process. When dissimilar charges are generated in adjacent mask pattern portions, a current is generated in the sub-resolution wire extending between the mask pattern portions, thereby preventing bridging of the masking material by balancing the dissimilar charges.

In another embodiment, a method for generating the reticle having sub-resolution wires includes combining data defining the lithographic mask pattern with frame data defining a grid of intersecting sub-resolution lines. A lithographic mask pattern is then formed on a surface of the reticle using the combined data according to known techniques. The combined lithographic pattern includes at least one sub-resolution wire extending between adjacent mask portions such that, when dissimilar charges are generated in the adjacent mask pattern portions during the fabrication process, current flows through the sub-resolution wire to equalize the charges.

In another embodiment of the present invention, a transparent conductive film is formed under or over the lithographic mask pattern to balance dissimilar charges that are generated in adjacent mask pattern portions. Because the conductive film (e.g., Indium-Tin Oxide (ITO) or Molybdenum Silicide (MoSi) less than 50 angstroms thick) is transparent, it does not generate lithographic features on the underlying semiconductor substrate during the fabrication process. When higher frequency radiation is used to expose the photoresist, mask materials may be different, for example when x-ray radiation is used, tantalum may be used for forming the opaque pattern regions and aluminum for forming the transparent conductive regions. When dissimilar charges are generated in adjacent mask pattern portions, a current is generated in sections of the transparent conductive film extending between the mask pattern portions, thereby preventing bridging of the masking material by balancing the dissimilar charges.

In accordance with a second aspect of the present invention, a reticle is modified to break elongated portions of the lithographic mask pattern into relatively small segments that are separated by sub-resolution gaps. The sub-resolution gaps are less than the resolution value, and therefore do not generate lithographic features on the underlying semiconductor substrate during the fabrication process. In other words, the lithographic image formed on the underlying semiconductor substrate is a continuous elongated structure that is not separated into segments. By separating the elongated portions into smaller segments on the reticle, the amount of charge generated on each segment is minimized, thereby reducing the potential between adjacent portions of the lithographic mask pattern and preventing bridging of the masking material.

In another embodiment, a method for generating the reticle having elongated mask portions separated by sub-resolution gaps includes combining data defining the lithographic mask pattern with data defining a grid of intersecting sub-resolution grooves. A lithographic mask pattern is then formed on a surface of the reticle using the combined data according to known techniques. Each elongated portion of the combined lithographic pattern is separated into at least two segments by a sub-resolution gap, which is part of one of the grooves, such that the segments are electrically isolated.

The present invention will be more fully understood in view of the following description and drawings.

BRIEF DESCRIPTION OF THE DRAWINGS

FIGS. 7(A) and 7(B) are perspective views showing portions of reticles formed in accordance with two additional embodiments of the present invention;

FIGS. 8(A) and 8(B) are cross-sectional elevation views taken along line 8A—8A of FIG. 7(A) and line 8B—8B of line 7(B), respectively;

DETAILED DESCRIPTION

The present invention is directed to a reticle that is modified to prevent bridging of the masking material (e.g., chrome) between adjacent portions of the lithographic mask pattern during an IC fabrication process. Evidence shows that this bridging problem may be due to electro-static discharge (ESD), which is caused by dissimilar charges stored on the adjacent pattern portions 106 and 107 of mask pattern 100. These dissimilar charges may be generated by the rapid movement of reticle 100 by, for example, a stepper apparatus. The modifications provided in accordance with the present invention address the bridging problem either by balancing these dissimilar charges, or by minimizing these dissimilar charges, thereby reducing the potential between adjacent portions below that required to generate the masking material bridging problem. In accordance with a first aspect of the present invention, electrical connections are provided between the various portions of the lithographic mask pattern formed on a reticle, thereby balancing the dissimilar charges generated in adjacent portions. Exemplary reticles incorporating the first aspect are described below with reference to FIGS. 3–8(B). In accordance with a second aspect of the present invention, the dissimilar charges are minimized by separating relatively large portions of the lithographic mask pattern into relatively small segments, thereby greatly decreasing the capacitance (i.e., charge-storing ability) of each portion. A reticle incorporating this second aspect is described below with reference to FIGS. 9 and 10.

As used herein, the term "sub-resolution" refers to a mask feature size that is less than the resolution value of an exposure tool utilized to form an IC during a fabrication process. By definition, a sub-resolution feature is not transferred onto a semiconductor substrate during a lithographic process of the fabrication process that utilizes the reticle upon which the sub-resolution feature is formed. Accordingly, a sub-resolution wire is a wire formed on a reticle that has a width less than the resolution value defined by the fabrication process in which the reticle is intended to be used. Similarly, a sub-resolution gap is a space between two masking material portions formed on a reticle that has a width less than the resolution value defined by the fabrication process in which the reticle is intended to be used. In some embodiments, a sub-resolution feature line/space is smaller than the smallest (narrowest) line/space that can be printed by a mask house (e.g., one-fourth of the resolution value).

Figure 1:
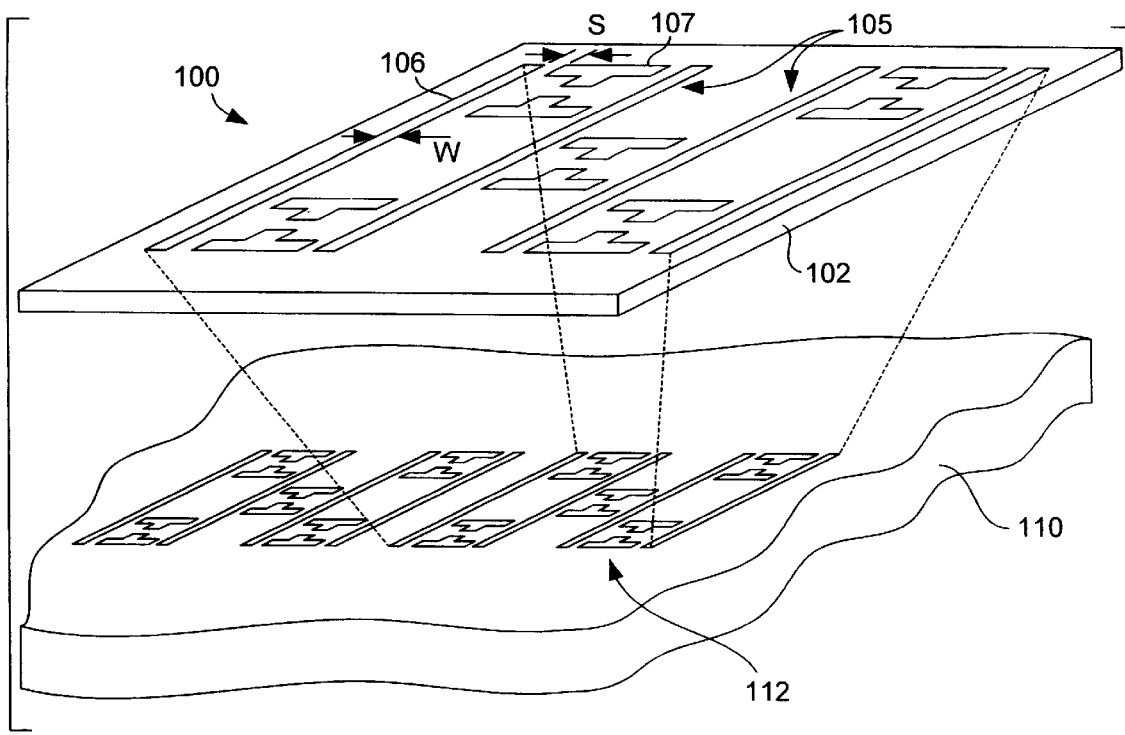
FIG. 1 is a perspective view showing a conventional reticle and a semiconductor substrate.
Figure 2:
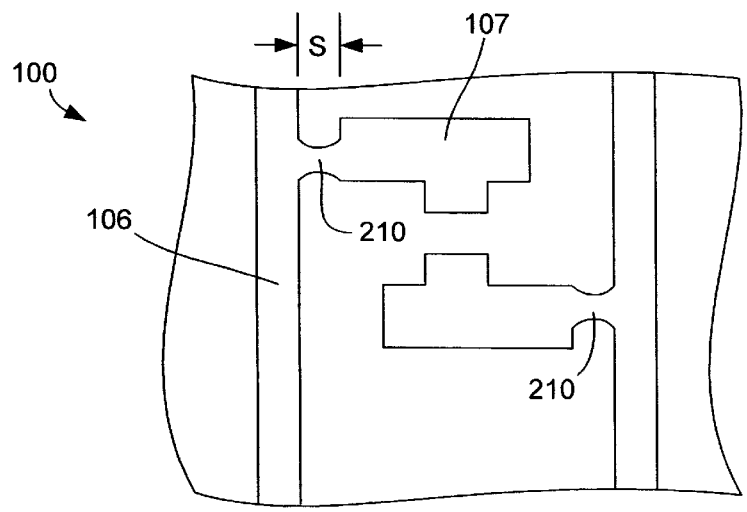
FIG. 2 is a plan view showing a portion of the conventional reticle after mask damage caused by ESD.
Figure 3:
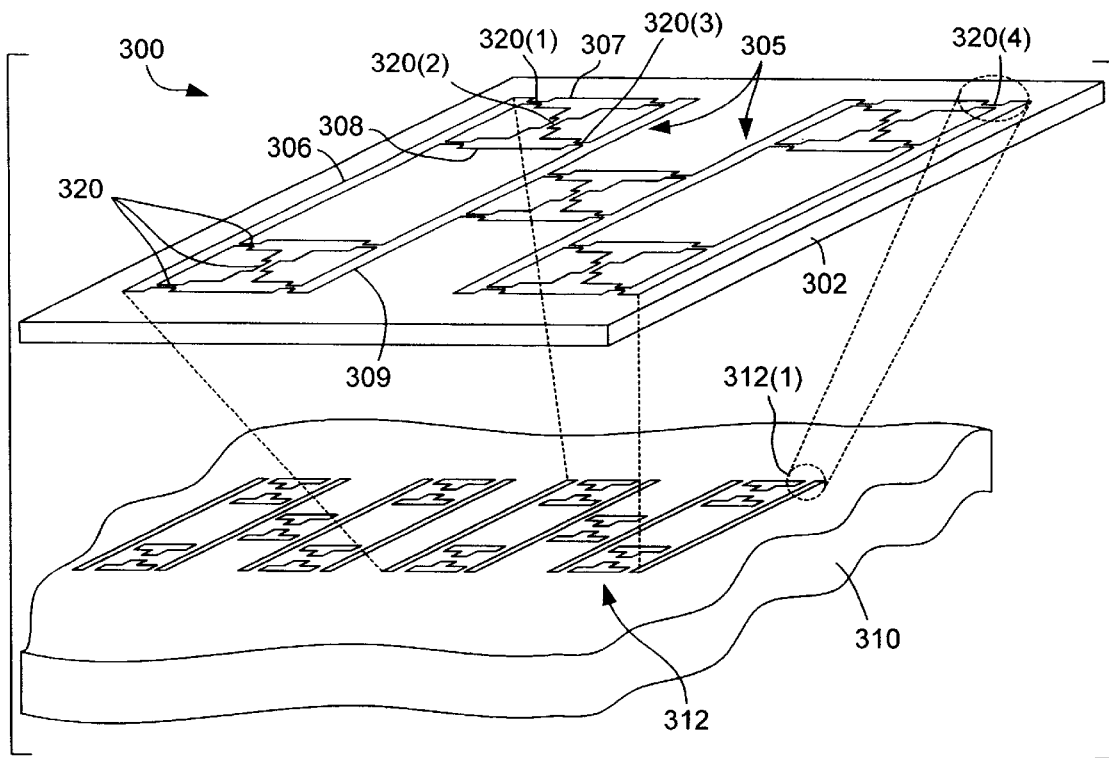
FIG. 3 is a perspective view including a reticle formed in accordance with a first embodiment of the present invention.

FIG. 3 is a perspective view showing a reticle 300 formed in accordance with a first embodiment of the present invention. Reticle 300 includes a transparent substrate (e.g., quartz) having a lithographic mask pattern 315 formed thereon. Mask pattern 315 is formed from a layer of opaque masking material (e.g., chrome) that is etched using known techniques. Similar to the sample mask pattern utilized in the description of conventional mask 100 (see FIG. 1), mask pattern 315 includes several elongated mask pattern portions (e.g., portion 306 and portion 309), and several relatively localized mask pattern portions (e.g., portion 307 and portion 308).

In accordance with the first embodiment, mask pattern 315 is modified over conventional masks to include several sub-resolution wires 320 that electrically connect adjacent mask pattern portions. For example, elongated mask pattern portion 306 is connected to mask pattern portion 307 by a first sub-resolution wire 320(1), mask pattern portion 307 is connected to mask pattern portion 308 by a second sub-resolution wire 320(2), and mask pattern portion 308 is connected to elongated mask pattern portion 309 by a third sub-resolution wire 320(3).

Also shown in FIG. 3 is a semiconductor substrate 310 upon which lithographic mask pattern 305 is optically transferred during a lithographic step of an integrated circuit fabrication process. According to the present invention, only the mask pattern portions (e.g., portions 306–309) of lithographic mask pattern 315 are transferred onto semiconductor substrate 310 during the lithographic step. Because the width of each sub-resolution wire 320 is less than the resolution value defined by the fabrication process, none of the sub-resolution wires 320 are optically transferred onto semiconductor substrate 310. For example, FIG. 3 shows an image (shadow) portion 312(1) formed on semiconductor substrate 310 that is optically transferred from a portion of reticle 300 that includes sub-resolution wire 320(4). As indicated in image portion 312(1), due to its small width, no image is formed on semiconductor substrate 312 that corresponds with sub-resolution wire 320(4). Similarly, none of the other sub-resolution wires incorporated into lithographic mask pattern 305 are optically transferred onto semiconductor substrate 310.

Figure 4:
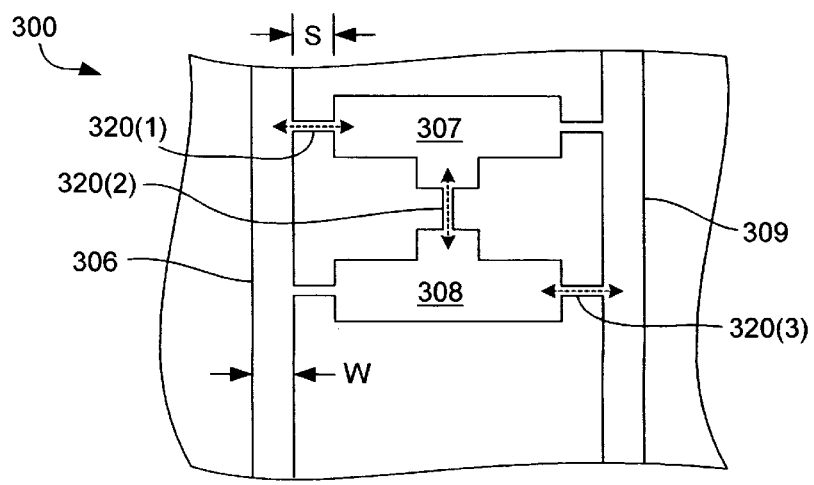
FIG. 4 is a plan view showing a portion of the reticle shown in FIG. 3.

FIG. 4 is a plan view showing a portion of reticle 300 that includes image portions 306 through 309. As discussed above, bridging of the mask material between adjacent mask pattern portions in conventional reticles is caused by dissimilar charges that are built up during a fabrication process. In accordance with the first embodiment, the sub-resolution wires balance these dissimilar charges by providing a conductive path between the adjacent mask pattern portions. For example, when dissimilar charges are generated in mask pattern portions 306 and 307, a current is generated in sub-resolution wire 320(1) that extends between these mask pattern portions (the current is indicated by the dashed line through sub-resolution wire 320(1)). This current discharges the more positive of the two dissimilar charges stored on mask pattern portions 306 and 307 to the more negative charge until these charges are balanced. Similarly, dissimilar charges between mask pattern portions 307 and 308 are balanced by a current flowing through sub-resolution wire 320(2), and dissimilar charges between mask pattern portions 308 and 309 are balanced by a current flowing through sub-resolution wire 320(3). By balancing dissimilar charges in this manner, the present invention prevents bridging of the masking material between adjacent mask pattern portions, thereby facilitating the development of fabrication processes that define ever-smaller resolution values and critical dimensions.

Figure 5:
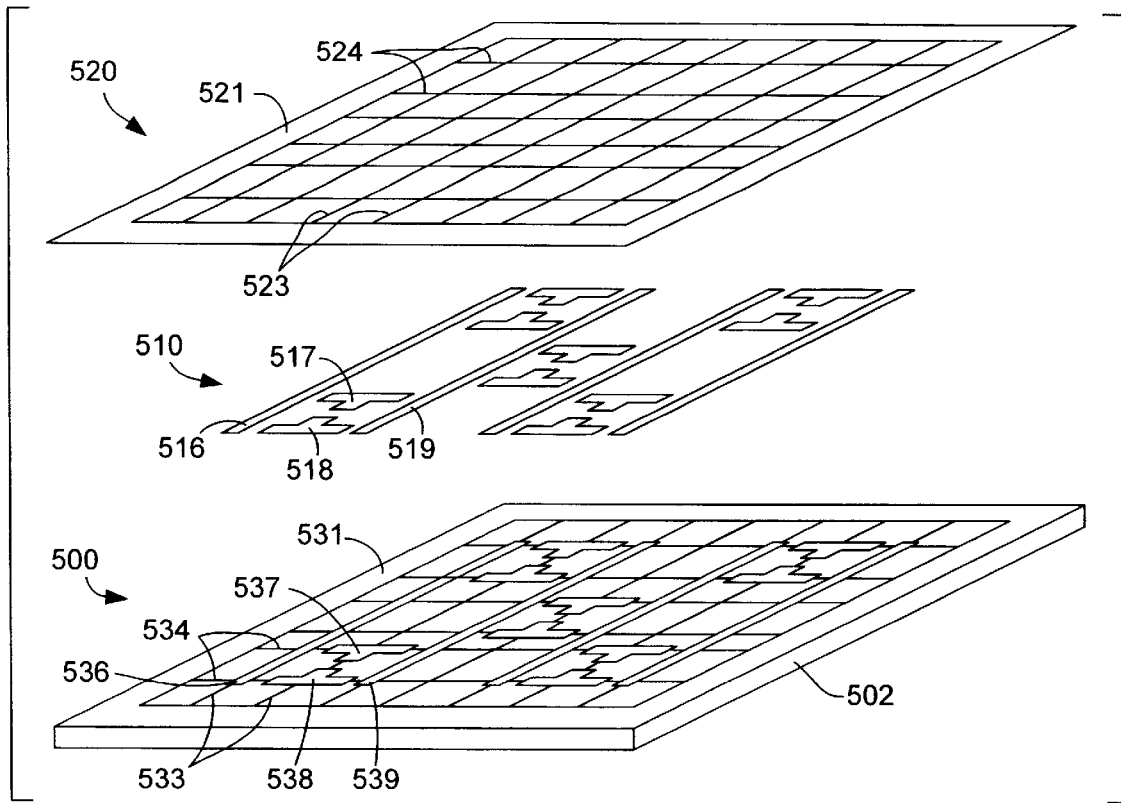
FIG. 5 is an exploded perspective view depicting the formation of a reticle in accordance with another embodiment of the present invention.

FIG. 5 is an exploded perspective view depicting a process for forming a reticle 500 in accordance with another embodiment of the present invention. Depicted above reticle 500 are graphical representations of data components that are combined using CAD (software) tools to form the lithographic mask pattern of reticle 500. Specifically, pattern data 510 is combined with frame data 520 to produce the lithographic mask pattern on a transparent substrate 502. As indicated in FIG. 5, pattern data 510 includes data representing several discrete portions, including portions 516 through 519, that are to be formed on reticle 500. Frame data 520 includes a peripheral region 521 and multiple intersecting vertical lines 523 and horizontal lines 524. Each of the vertical lines 523 and horizontal lines 524 has a sub-resolution width. When pattern data 510 is combined with frame data 520, and the combined data is used to generate a lithographic mask pattern on transparent substrate 502, the resulting mask pattern portions (e.g., portions 536 through 539) are inter-connected by a grid of vertical sub-resolution line segments (wires) 533 and horizontal sub-resolution line segments (wires) 534. Similar to the first embodiment (described above) these sub-resolution wires provide paths through which dissimilar charges are balanced. In addition, these sub-resolution wires allow these charges to be discharged to a peripheral frame region 531, which forms an equipotential plane.

Figure 6:
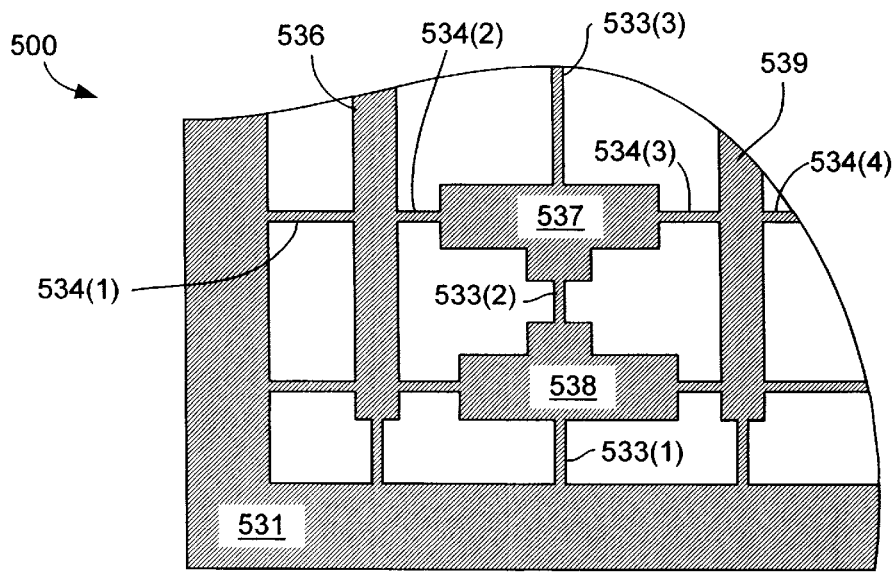
FIG. 6 is a plan view showing a portion of the reticle shown in FIG. 5.

FIG. 6 is a plan view showing a portion of reticle 500 in additional detail. Shading is provided to indicate portions of reticle 500 that are covered by masking material (e.g., chrome), and the non-shaded portions indicate etched portions through which the upper surface of transparent substrate 502 (see FIG. 5) is exposed. Specifically, mask pattern portions 536 through 539, which are formed in accordance with pattern data 510, have widths that are equal to or greater than an associated fabrication process resolution value. Sub-resolution wires that are formed in accordance with frame data 520 (see FIG. 5) interconnect these portions. For example, a horizontal line of frame data 520 is superimposed on pattern data 520 to form a first sub-resolution wire 534(1) connected between peripheral frame region 531 to pattern portion 536, a second sub-resolution wire 534(2) that is connected between pattern portion 536 and pattern portion 537, a third sub-resolution wire 534(3) connected between pattern portion 537 and pattern portion 539, etc. Similarly, a vertical line of frame data 520 is superimposed on pattern data 520 to form a first sub-resolution wire 533(1) connected between peripheral frame region 531 and pattern portion 538, a second sub-resolution wire 533(2) connected between pattern portion 538 and pattern portion 537, and a third sub-resolution wire extending upward from pattern portion 537. Note that a charge generated in, for example, pattern portion 537 can be discharged to peripheral frame region 531 via sub-resolution wires 534(1), pattern portion 536, and sub-resolution wire 534(2). Accordingly, dissimilar charges generated in the mask pattern portions of reticle 500 are balanced or discharged, thereby preventing the mask material bridging problem associated with conventional reticles.

FIG. 7(A) is a perspective view showing a portion of a reticle 700 formed in accordance with another embodiment of the present invention. Reticle 700 includes a transparent substrate 702 upon which is formed a lithographic mask pattern in accordance with the methods described above. However, unlike the specific embodiments described above, reticle 700 includes a transparent conductive film 710 that is formed over the lithographic mask pattern to balance dissimilar charges that are generated in adjacent mask pattern portions.

FIG. 8(A) is a cross-sectional elevation view taken along line 8A—8A of FIG. 7(A), and shows a portion of reticle 700 located between a UV light source and a semiconductor substrate (wafer). Note that transparent conductive film 710 is formed on top of mask pattern portions 706 and 707, which reflect UV light, and is also formed on exposed portions of transparent substrate 702, through which UV light passes to expose corresponding portions of the semiconductor substrate. Because conductive film 710 (e.g., Indium-Tin oxide (ITO), thin Molybdenum Silicide (MoSi), or thin aluminum) is transparent, it does not generate lithographic features on the underlying semiconductor substrate during the fabrication process. However, when dissimilar charges are generated in adjacent mask pattern portions 706 and 707, a current is generated in section 710(1) of transparent conductive film 710, thereby preventing bridging of the masking material by balancing the dissimilar charges.

FIG. 7(B) is a perspective view showing a portion of a reticle 750 formed in accordance with yet another embodiment of the present invention. Reticle 750 includes a transparent substrate 752 upon which is formed a transparent conductive film 760, and further includes a lithographic mask pattern formed on transparent conductive film 760 in accordance with the methods described above. Similar to transparent conductive film 710 (described above with reference to FIG. 7(A)), transparent conductive film 760 provides conductive paths that balance dissimilar charges generated in adjacent mask pattern portions of the lithographic mask pattern.

FIG. 8(B) is a cross-sectional elevation view taken along line 8B—8B of FIG. 7(B), and shows a portion of reticle 750 located between a UV light source and a semiconductor substrate (wafer). Note that transparent conductive film 760 is formed between mask pattern portions 756 and 757, which reflect UV light, and an upper surface of transparent substrate 752. Because conductive film 760 (e.g., ITO or MoSi having a thickness of 50 angstroms) is transparent, it does not generate lithographic features on the underlying semiconductor substrate during the fabrication process. Further, because conductive film 760 is formed directly on transparent substrate 752, there is less chance of interference with UV rays near the edges of the mask pattern portions (e.g., mask pattern portions 756 and 757). As in the embodiment shown in FIG. 8(A), when dissimilar charges are generated in adjacent mask pattern portions 756 and 757, a current is generated in section 760(1) of transparent conductive film 760, thereby preventing bridging of the masking material by balancing the dissimilar charges. Further, because conductive film 760 is formed directly on transparent substrate 752, there is less chance of interference with UV rays near the edges of the mask pattern portions (e.g., mask pattern portions 756 and 757).

In accordance with the second aspect of the present invention, a reticle is modified to break elongated portions of the lithographic mask pattern into relatively small segments that are separated by sub-resolution gaps. The present inventors believe a significant increase in mask material bridging is due to charges generated in elongated mask portions, which act like antennae during the fabrication process. The second aspect of the present invention reduces this antenna effect by segmenting the elongated mask portions. Similar to the first aspect, described above, the sub-resolution gaps utilized to segment the elongated mask portions are less than the resolution value, and therefore do not generate lithographic features on the underlying semiconductor substrate during the fabrication process.

Figure 9:
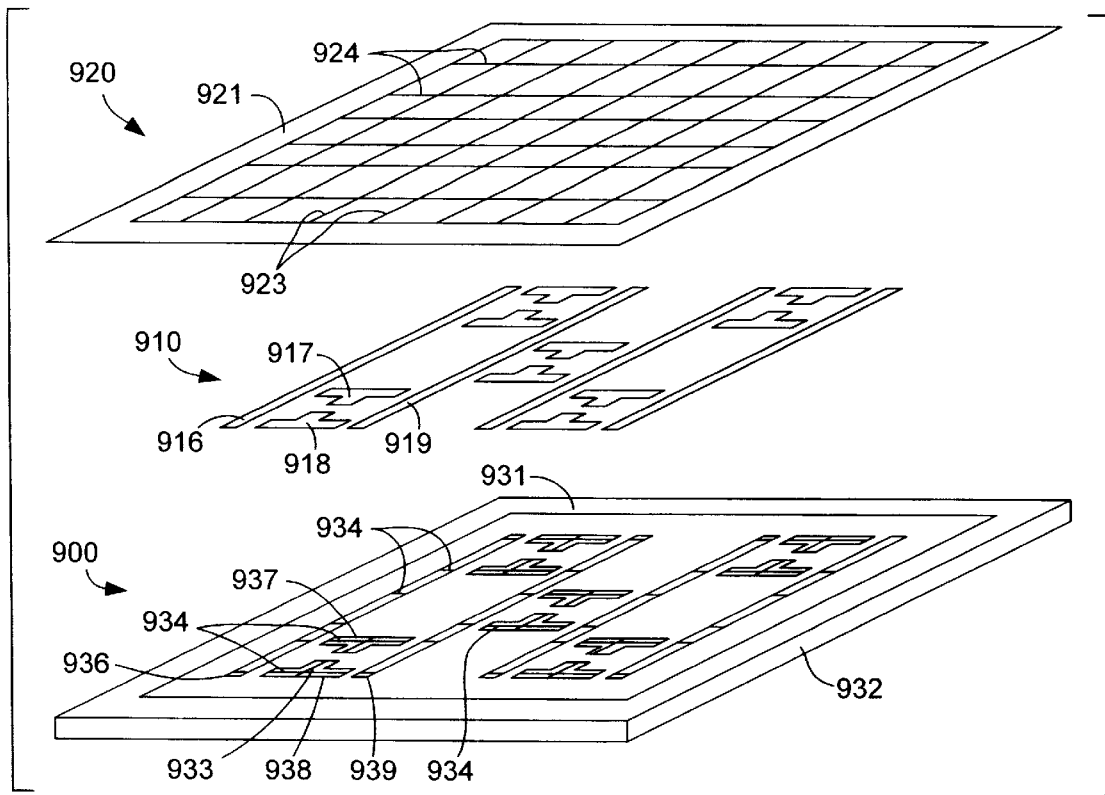
FIG. 9 is an exploded perspective view depicting the formation of a reticle in accordance with another embodiment of the present invention.

FIG. 9 is an exploded perspective view depicting the formation of a reticle 900 formed in accordance with the second aspect of the present invention. Depicted above reticle 900 are graphical representations of data components that are combined using CAD (software) tools to form the lithographic mask pattern of reticle 900. Specifically, pattern data 910 is combined with frame data 920 to produce the lithographic mask pattern on a transparent substrate 902. As indicated in FIG. 9, pattern data 910 includes data representing several discrete portions, including portions 916 through 919. Frame data 920 includes a peripheral region 921 and multiple intersecting vertical grooves 923 and horizontal grooves 924. Each of the vertical grooves 923 and horizontal grooves 924 has a sub-resolution width. When pattern data 910 is combined with frame data 920, and the combined data is used to generate a lithographic mask pattern on transparent substrate 902, the resulting mask pattern portions (e.g., portions 936 through 939) are segmented by vertical sub-resolution gaps 933 and horizontal sub-resolution gaps 934. For example, elongated mask pattern portion 936 is separated into several segments by horizontal gaps 934. By separating elongated portion 936 into smaller segments on reticle 900, the amount of charge generated on each segment is reduced, thereby preventing bridging of the mask material by reducing the potential between elongated portion 936 and adjacent mask portions (e.g., mask portions 937 and 938) of the lithographic mask pattern. However, because horizontal gaps 934 have sub-resolution widths, a lithographic image formed on an underlying semiconductor substrate by elongated mask pattern portion 936 is a continuous elongated structure that is not separated into segments.

Figure 10:
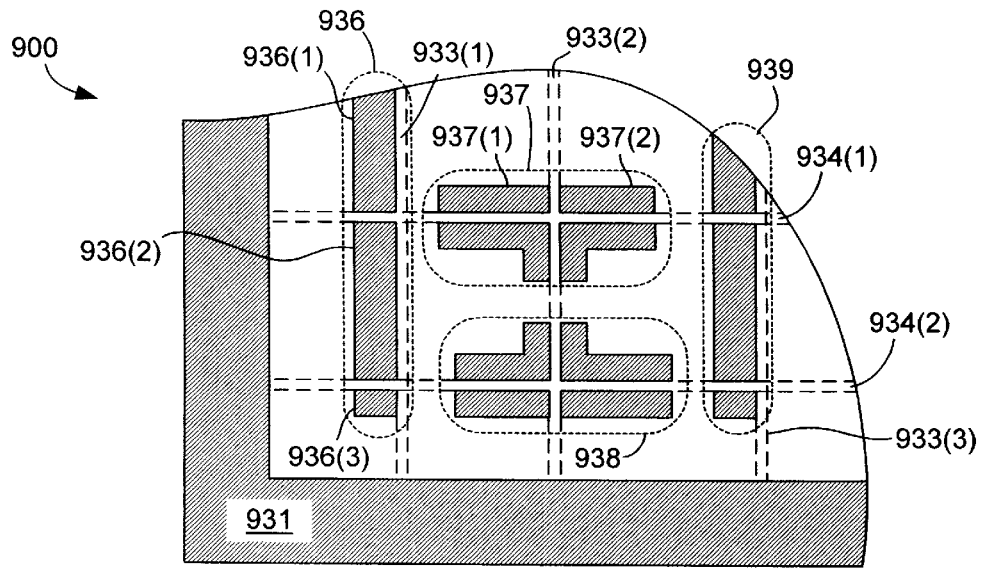
FIG. 10 is a plan view showing a portion of the reticle shown in FIG. 9.

FIG. 10 is a plan view showing a portion of reticle 900 in additional detail. Shading is provided to indicate portions of reticle 900 that are covered by masking material (e.g., chrome), and the non-shaded portions indicate etched portions through which the upper surface of transparent substrate 932 (see FIG. 9) is exposed. Specifically, mask pattern portions 936 through 939, which are formed in accordance with the combined pattern data 910 and frame data 920, are indicated as separated into segments by sub-resolution gaps that are defined by the vertical grooves 923 and horizontal grooves 924 of the frame data (see FIG. 9). For example, a first horizontal groove 934(1) forms a sub-resolution gap 934(1A) that separates elongated pattern portion 936 into segments 936(1) and 936(2), and a second horizontal groove 934(2) forms a sub-resolution gap 934(2A) that separates segments 936(2) and 936(3). In one embodiment, each segment of elongated pattern portion 936 (e.g., segment 936(2)) has a length of 3,000 angstroms or less. Accordingly, a charge generated in, for example, segment 936(1) is substantially less than a charge generated in non-segmented pattern portion 936. Accordingly, dissimilar charges generated in the mask pattern portions of reticle 500 are minimized, thereby preventing the mask material bridging problem associated with conventional reticles.

As indicated in FIG. 10, first horizontal groove 934(1) also intersects pattern potions 937 and 939, thereby separating these pattern portions into smaller segments. In an alternative embodiment, design rules incorporated into the CAD tool implementing the present invention may prevent the segmentation of relatively small (localized) mask pattern portions, such as pattern portions 937 and 938.

Similar to the horizontal grooves, vertical grooves 933(1) through 933(3) of frame data 920 are superimposed on pattern data 520 to form a sub-resolution gaps. For example, groove 933(2) separates pattern portion 937 into segments 937(1) and 937(2). In one embodiment, design rules incorporated into the CAD tool implementing the present invention may align grooves along the edges of mask pattern portions that are close to the resolution value. For example, vertical grooves 933(1) and 933(3) are aligned with the edges of elongated mask portions 936 and 939, thereby preventing narrowing of the widths of these portions below the resolution value.

As suggested above, in addition to the specific embodiments disclosed herein, other modifications to conventional reticles are also possible that fall within the spirit and scope of the present invention. Therefore, the invention is limited only by the following claims.

What is claimed is:

1. A reticle comprising a lithographic mask pattern formed thereon for optically transferring the lithographic mask pattern onto a semiconductor substrate during an integrated circuit fabrication process, wherein the lithographic mask pattern includes an elongated mask pattern portion for optically transferring a continuous elongated shadow on the semiconductor substrate, and wherein the elongated mask pattern portion includes first and second segments separated by a sub-resolution gap such that the first segment is electrically isolated from the second segment.

2. The reticle according to claim 1, wherein a width of the sub-resolution gap is less than a resolution value defined by the fabrication process.

3. The reticle according to claim 1, further comprising a grid of intersecting sub-resolution grooves, wherein the sub-resolution gap is formed by a portion of one of the sub-resolution grooves that intersects the elongated mask pattern portion.

4. The reticle according to claim 3, wherein a width of each of the sub-resolution grooves is less than a resolution value defined by the fabrication process.

5. The reticle according to claim 4, wherein the elongated mask pattern structure comprises chrome.

\* \* \* \* \*